(12) United States Patent
Chang

(10) Patent No.: US 12,332,300 B2
(45) Date of Patent: Jun. 17, 2025

(54) TESTING DEVICE AND TESTING METHOD THEREOF

(71) Applicant: Winbond Electronics Corp., Taichung (TW)

(72) Inventor: Kuan-Cheng Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 179 days.

(21) Appl. No.: 18/317,100

(22) Filed: May 15, 2023

(65) Prior Publication Data

US 2024/0302428 A1    Sep. 12, 2024

(30) Foreign Application Priority Data

Mar. 10, 2023   (TW) ................................ 112109018

(51) Int. Cl.
*G01R 31/28* (2006.01)
*G01R 31/319* (2006.01)

(52) U.S. Cl.
CPC ..... *G01R 31/2841* (2013.01); *G01R 31/2874* (2013.01); *G01R 31/31905* (2013.01)

(58) Field of Classification Search
CPC ............ G01R 31/2841; G01R 31/2874; G01R 31/374; G01R 31/388; G01R 31/3828; G01R 31/31905; G01R 31/3648; G01R 21/06; G01R 31/2851; G01R 31/318508; G01R 31/318544; G01R 31/318558; G06F 11/3051; G06F 3/0416; G06F 1/3215;
(Continued)

(56) References Cited

U.S. PATENT DOCUMENTS 6,941,243 B1 *  9/2005  Maciona ............... G06F 11/263
                                                                702/182
6,961,871 B2 * 11/2005  Danialy ........... G01R 31/31724
                                                                714/39
(Continued)

FOREIGN PATENT DOCUMENTS

CN        207937559        10/2018
CN        111562479         4/2021
(Continued)

OTHER PUBLICATIONS

"Office Action of Taiwan Counterpart Application", issued on Aug. 28, 2023, p. 1-p. 10.

*Primary Examiner* — Vinh P Nguyen
(74) *Attorney, Agent, or Firm* — JCIPRNET

(57) ABSTRACT

A testing device and a testing method thereof. The testing device includes a controller and a data storage device. The controller receives multiple command sequences respectively sent by application platforms through an input interface. The data storage device stores multiple circuit information corresponding to each of the application platforms and each of the command sequences corresponding to each of the application platforms. The controller, during a test period, is connected to at least one device under test through an output interface. The controller executes a test operation on the at least one device under test according to each of the circuit information corresponding to each of the application platforms and each of the command sequences corresponding to each of the application platforms.

18 Claims, 3 Drawing Sheets

(58) Field of Classification Search
CPC ... G06F 11/30; G06F 1/20; G06F 9/44; G06F 30/30; G06F 16/2365; G06F 30/39; G06F 30/347; G06F 9/451; G06F 16/214; G06F 11/3476; G06F 11/3452; G06F 30/33; G06F 30/367; G11C 29/02; G06T 2207/10016

See application file for complete search history.

(56) References Cited

U.S. PATENT DOCUMENTS

| | | | |
|---|---|---|---|
| 7,552,370 B2 * | 6/2009 | Pochowski | G06F 11/263 |
| | | | 324/750.01 |
| 9,536,626 B2 * | 1/2017 | Schoenborn | G11C 11/4076 |
| 10,295,996 B2 * | 5/2019 | Yoshida | G05B 19/042 |
| 10,664,644 B1 * | 5/2020 | Bot | G01R 31/31917 |
| 11,747,400 B2 * | 9/2023 | Dosado | G01R 31/318314 |
| | | | 714/727 |
| 2014/0229666 A1 | 8/2014 | Schoenborn et al. | |

FOREIGN PATENT DOCUMENTS

| | | |
|---|---|---|
| CN | 113376504 | 9/2021 |
| CN | 115048312 | 9/2022 |
| CN | 115684895 | 2/2023 |
| CN | 115684896 | 2/2023 |
| TW | I546692 | 8/2016 |

\* cited by examiner

TESTING DEVICE AND TESTING METHOD THEREOF

CROSS-REFERENCE TO RELATED APPLICATION

This application claims the priority benefit of Taiwan application serial no. 112109018, filed on Mar. 10, 2023. The entirety of the above-mentioned patent application is hereby incorporated by reference herein and made a part of this specification.

BACKGROUND

Technical Field

The disclosure relates to a testing device and a testing method thereof, and in particular to a testing device and a testing method thereof corresponding to multiple application platforms.

Description of Related Art

In the era of continuous progress in technology scaling, it is impossible to rule out the related problems that may arise when the chip is used in various application platforms by using the conventional technology to test a chip through a large-scale professional testing machine.

For example, a chip tested by a conventional large-scale professional testing machine may work normally when used on a first application platform, but problems may occur when the chip is used on a second application platform. Therefore, a product tester needs to actually dispose the chip on different application platforms to know whether the chip can work normally.

With more and more types of products on the market, a product tester needs to collect more and more application platforms on the market. At the same time, considering the various possibilities of the short life cycle and short durability of the application platform, preparing spare parts is required, and cause an increase in the space occupied by the application platforms, and even the inability to have effective management, resulting in an increase in the cost of equipment dispositions and a reduction in testing productivity.

SUMMARY

The disclosure provides a testing device and a testing method thereof configured for multiple application platforms, which may correspond to the application platforms to execute a test operation on a device under test.

The testing device of the disclosure includes a controller and a data storage device. The controller is connected to multiple application platforms through an input interface. The controller receives multiple command sequences respectively sent by the application platforms through the input interface. The data storage device stores multiple circuit information corresponding to each of the application platforms and each of the command sequences corresponding to each of the application platforms. During the test period, the controller is connected to at least one device under test through an output interface, and the controller executes a test operation on the at least one device under test according to each of the circuit information corresponding to each of the application platforms and each of the command sequences corresponding to each of the application platforms.

The testing method of the disclosure includes: connections to multiple application platforms are made through an input interface; multiple command sequences respectively sent by the application platforms are received through the input interface; multiple circuit information corresponding to each of the application platforms and each of the command sequences corresponding to each of the application platforms are stored; a connection to at least one device under test is made through an output interface during the test period; and a test operation is executed on the at least one device under test according to each of the circuit information corresponding to each of the application platforms and each of the command sequences corresponding to each of the application platforms.

Based on the above, the testing device of the disclosure records the command sequences and the circuit information of multiple application platforms, and simulates each of the corresponding application platforms according to the command sequence corresponding to each of the application platforms and the circuit information corresponding to each of the application platforms to execute test operations on one or more devices under test. In this way, the testing device may effectively perform testing on the operating status of the device under test in various application platforms, testing efficiency is improved, and testing cost is greatly reduced.

DESCRIPTION OF THE EMBODIMENTS

Figure 1:
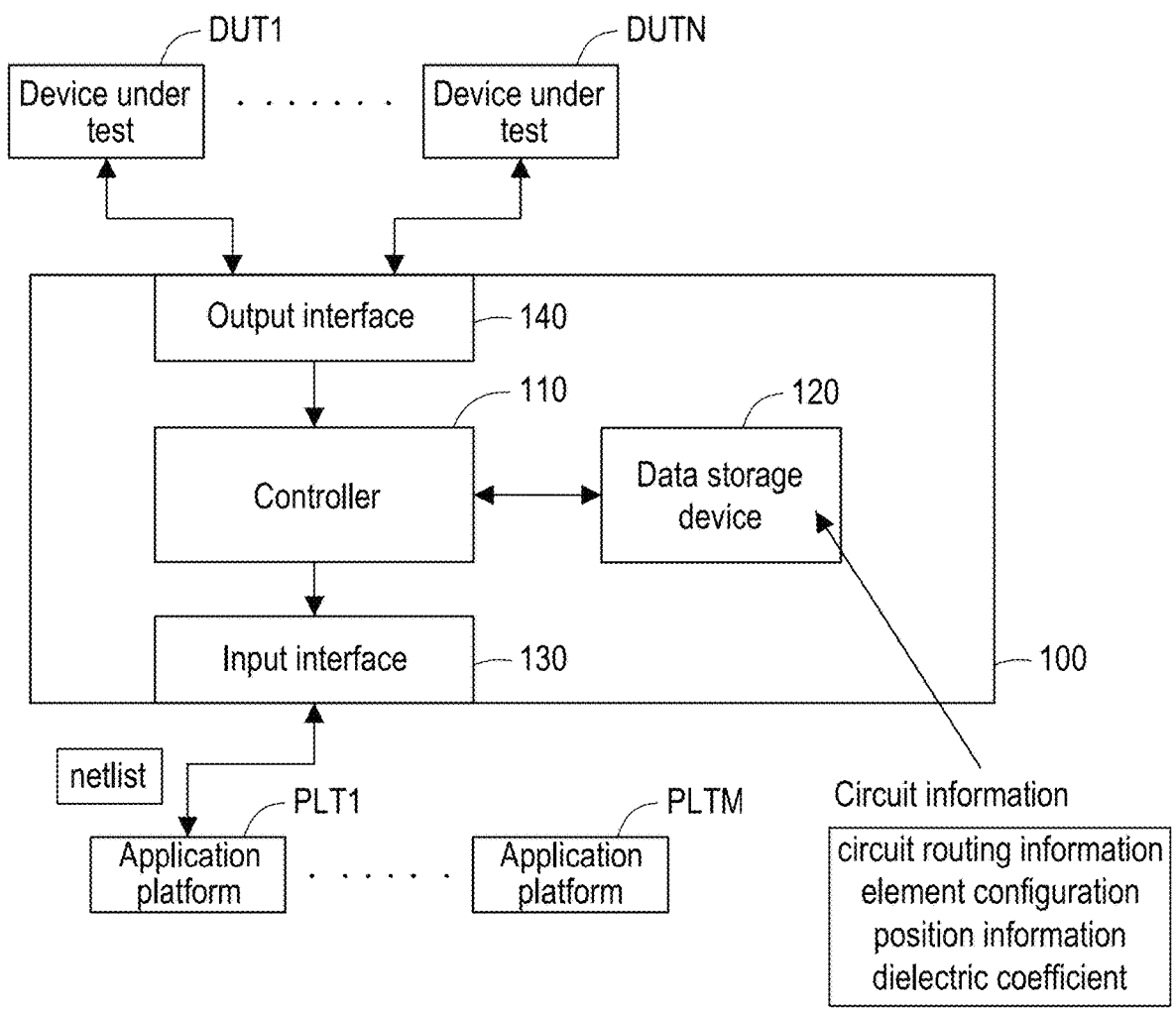
FIGS. 1 and 3 are schematic diagrams of testing devices according to different embodiments of the disclosure.

Please refer to FIG. 1, which is a schematic diagram of a testing device according to an embodiment of the disclosure. A testing device 100 includes a controller 110, a data storage device 120, an input interface 130 and an output interface 140. The controller 110 is coupled to the data storage device 120, the input interface 130 and the output interface 140.

In the embodiment, in the setting mode, the controller 110 may be connected to multiple application platforms PLT1 to PLTM through the input interface 130. The controller 110 may receive multiple command sequences respectively sent by the application platforms PLT1 to PLTM through the input interface 130, and stored the received command sequences in the dat storage device 120.

Please note here that the controller 110 may be connected to the application platforms PLT1 to PLTM one by one through the input interface 130, and receive the command sequences sent by the application platforms PLT1 to PLTM one by one. The controller 110 stores the command sequence corresponding to each of the application platforms PLT1 to PLTM in the data storage device 120.

On the other hand, the data storage 120 is configured to store multiple circuit information corresponding to each of the application platforms PLT1 to PLTM. In the embodiment of the disclosure, a designer may input a circuit netlist of each of the application platforms PLT1 to PLTM into the testing device 100. The controller 110 may obtain the parasitic effect generated by parasitic elements in the circuits corresponding to each of the application platforms PLT1 to PLTM by analyzing the circuit netlist of each of the application platforms PLT1 to PLTM.

In addition, the circuit information includes circuit routing information and element configuration position information of each of the application platforms, and a dielectric coefficient between multilayer circuit boards in each of the application platforms. The above-mentioned parasitic effect may further be caused by the state of circuit routing, the position of each of the element configuration and the dielectric coefficient of the dielectric layer between the printed circuit boards of each of the application platforms PLT1 to PLTM. In the embodiment of the disclosure, the designer may capture multiple images of the circuit boards of each of the application platforms PLT1 to PLTM, and transmit the above-mentioned images to the controller 110. The controller 110 may further know the routing state, element position and the dielectric coefficient of the dielectric layer between the circuit boards corresponding to each of the application platforms PLT1 to PLTM by analyzing the images of the circuit boards of each of the application platforms PLT1 to PLTM, and further obtain the circuit information of each of the application platforms PLT1 to PLTM.

In the setting mode, after the controller 110 records all the circuit information of the application platforms PLT1 to PLTM in the data storage device 120, the testing device 100 may enter the test mode. In the test mode, the testing device 100 may release the connection relationship with any one of the application platforms PLT1 to PLTM. The testing device 100 may also be connected to one or more devices under test DUT1 to DUTN through the output interface 140.

It should be noted that in the test mode, the testing device 100 may be simultaneously connected to the devices under test DUT1 to DUTN through the output interface 140, and perform test operations on the devices under test DUT1 to DUTN simultaneously. During the test period, the controller 110 may read the circuit information and the command sequence corresponding to each of the application platforms PLT1 to PLTM one by one from the data storage device 120, and generate a test signal group to perform a test operation on the devices under test DUT1 to DUTN according to each of the circuit information and each of the command sequences corresponding to each of the application platforms PLT1 to PLTM. In detail, a test engineer may provide a testing program to the controller 110, the controller 110 may execute the testing program, generate a test signal group according to each of the circuit information and each of the command sequences corresponding to each of the application platforms PLT1 to PLTM, and transmit the test signal group to the devices under test DUT1 to DUTN through the output interface 140, so as to complete the test operation of one or more devices under test DUT1 to DUTN synchronously.

In the embodiment, the controller 110 may calculate the parasitic effect in each of the application platforms PLT1 to PLTM according to the circuit information corresponding to each of the application platforms PLT1 to PLTM, and perform an adjust operation on the signal time sequence of the test signal group according to the parasitic effect corresponding to each of the application platforms PLT1 to PLTM. In this way, the testing device 100 may effectively simulate the transmission status of the command of each of the application platforms PLT1 to PLTM, and then perform testing on the devices under test DUT1 to DUTN through the test signal group according to the command sequence of each of the application platforms PLT1 to PLTM.

In the light of the above description, the testing device 100 of the embodiment of the disclosure may receive the command sequences and circuit information of the application platforms PLT1 to PLTM to separately and sequentially simulate the application platforms PLT1 to PLTM according to the above-mentioned command sequences and circuit information, and send the test signal group to complete the test operations of the devices under test DUT1 to DUTN. In this way, the testing device 100 may quickly execute the test operation on the application side of the devices under test DUT1 to DUTN, and the cost of the test operation may be effectively saved.

Incidentally, in the embodiment, the devices under test DUT1 to DUTN may be memories, such as dynamic random access memories. The application platform may be any electronic device that needs to be loaded with memory, and there is no specific limitation.

Figure 2:
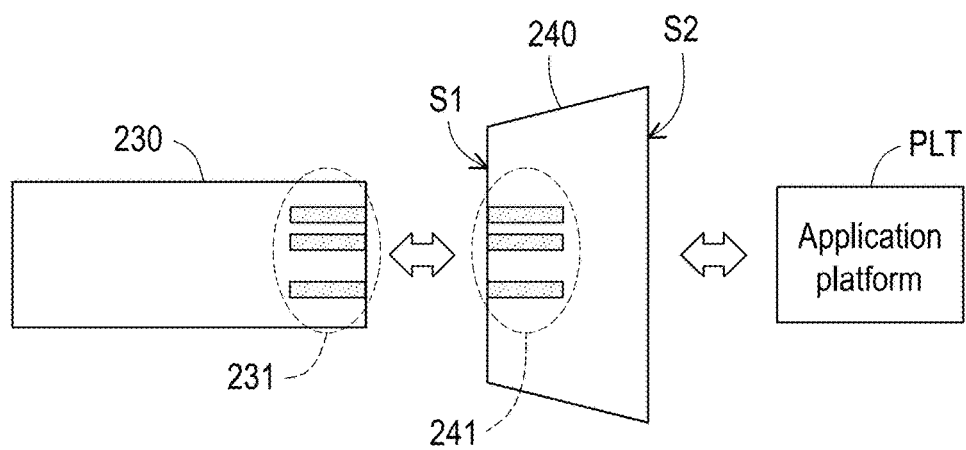
FIG. 2 is a schematic diagram of the connection relationship between a testing device and an application platform in an embodiment of the disclosure.

Please refer to FIG. 2 for the following. FIG. 2 is a schematic diagram of the connection relationship between a testing device and an application platform in an embodiment of the disclosure. In the embodiment of the disclosure, the testing device further includes an adapter board 240. The adapter board 240 is configured to serve as a connection medium of an input interface 230 of the testing device and an application platform PLT. In detail, the adapter board 240 has a first terminal S1 to be electrically connected to the input interface 230 of the testing device. The adapter board 240 also has a second terminal S2 to be electrically connected to the application platform PLT. The connection terminal on the second terminal S2 of the adapter board 240 may be custom designed corresponding to the input/output interface of the application platform PLT, and there is no fixed form. The connection terminal on the first terminal S1 of the adapter board 240 may be standard designed corresponding to the input interface 230 of the testing device. In the embodiment, for example, the transmission serial bus on the input interface 230 of the testing device has a connection terminal 231 in the form of a golden finger, and the connection terminal on the first terminal S1 of the adapter board 240 may correspond to the connection terminal 231, and be another connection terminal 241 in the form of a golden finger. In this way, when the input interface 230 of the testing device is to be electrically connected to the application platform PLT, the connection terminals 231 and 241 may be prepared for mutual alignment and pressed together through a simple jig.

In the embodiment, in the testing device, multiple adapter boards may be provided corresponding to multiple application platforms. In this way, the input interface 230 of the testing device may be connected to the corresponding adapter boards one by one through the adapter boards through a simple pressing method. The use of manpower to perform a connect operation on the testing device and the application platform is effectively eliminated, the efficiency of test operations is effectively improved and labor cost is reduced.

Figure 3:
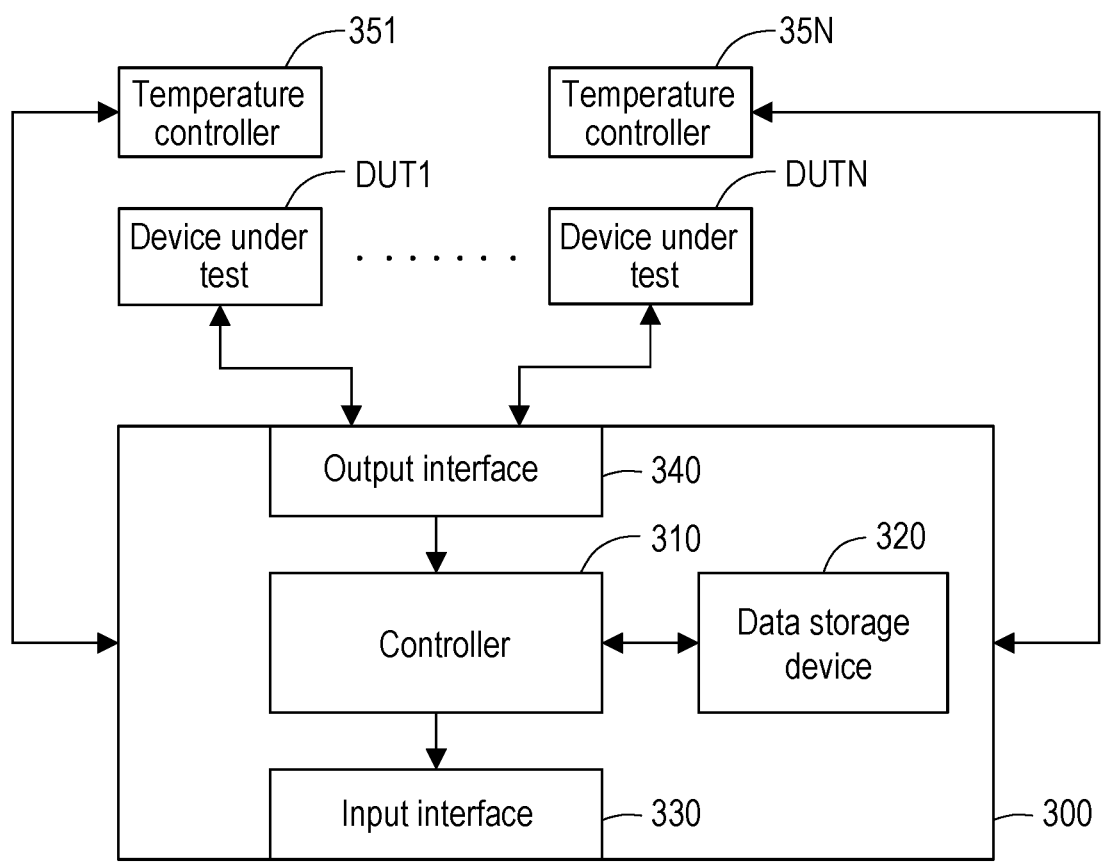

Please refer to FIG. 3 for the following. FIG. 3 is a schematic diagram of a testing device according to another embodiment of the disclosure. A testing device 300 includes a controller 310, a data storage device 320, an input interface 330, an output interface 340 and multiple temperature controllers 351 to 35N. The controller 310 is coupled to the data storage device 320, the input interface 330 and the output interface 340. The controller 310 may also be coupled to the temperature controllers 351 to 35N. In the embodiment, the temperature controllers 351 to 35N are disposed corresponding to the devices under test DUT1 to DUTN.

In the embodiment, during the test period, the controller 310 may respectively adjust the ambient temperature of the devices under test DUT1 to DUTN through the temperature controllers 351 to 35N, and transmit the test signal group through the output interface 340 to test the durability of the devices under test DUT1 to DUTN according to the circuit information and the command sequence corresponding to each of the application platforms recorded in the data storage device 320. Each of the temperature controllers 351 to 35N may increase or decrease the ambient temperature of each of the corresponding devices under test DUT1 to DUTN, and complete the test operations of the devices under test DUT1 to DUTN under multiple ambient temperatures.

Incidentally, in order to increase the accuracy of the test operation, during the test period, the controller 310 may further calculate the temperature coefficient for the circuit information of each of the application platforms, and thereby adjusting the test signal group corresponding to the ambient temperature of the devices under test DUT1 to DUTN. Specifically, when the ambient temperature of the devices under test DUT1 to DUTN is a high test temperature, the controller 310 may perform a compensation operation for the circuit information of each of the application platforms for the high test temperature, and simulate the signal of the command that may be generated by each of the application platforms at the high test temperature to generate a test signal group. When the ambient temperature of the devices under test DUT1 to DUTN is a low test temperature, the controller 310 may perform a compensation operation for the circuit information of each of the application platforms for the low test temperature, and simulate the signal of the command that may be generated by each of the application platforms at the low test temperature to generate a test signal group.

The above-mentioned high test temperature may be a test temperature higher than the standard test temperature (for example, 25 degrees Celsius), and the above-mentioned low test temperature may be another test temperature lower than the standard test temperature, and there is no fixed limitation.

Incidentally, in the embodiment, the controller 310 may be a processor with computing capability. Alternatively, the controller 310 may be designed through a hardware description language (HDL) or any other digital circuit design method known to those skilled in the art, and a hardware circuit implemented through a field programmable gate array (FPGA), a complex programmable logic device (CPLD), or an application-specific integrated circuit (ASIC). The data storage device 320 may be any form of memory, hard disk, optical disk or solid state disk, etc., and there is no specific limitation.

In addition, both the output interface 340 and the input interface 330 may be any communication interface known to those skilled in the art, and there is no specific limitation.

Figure 4:
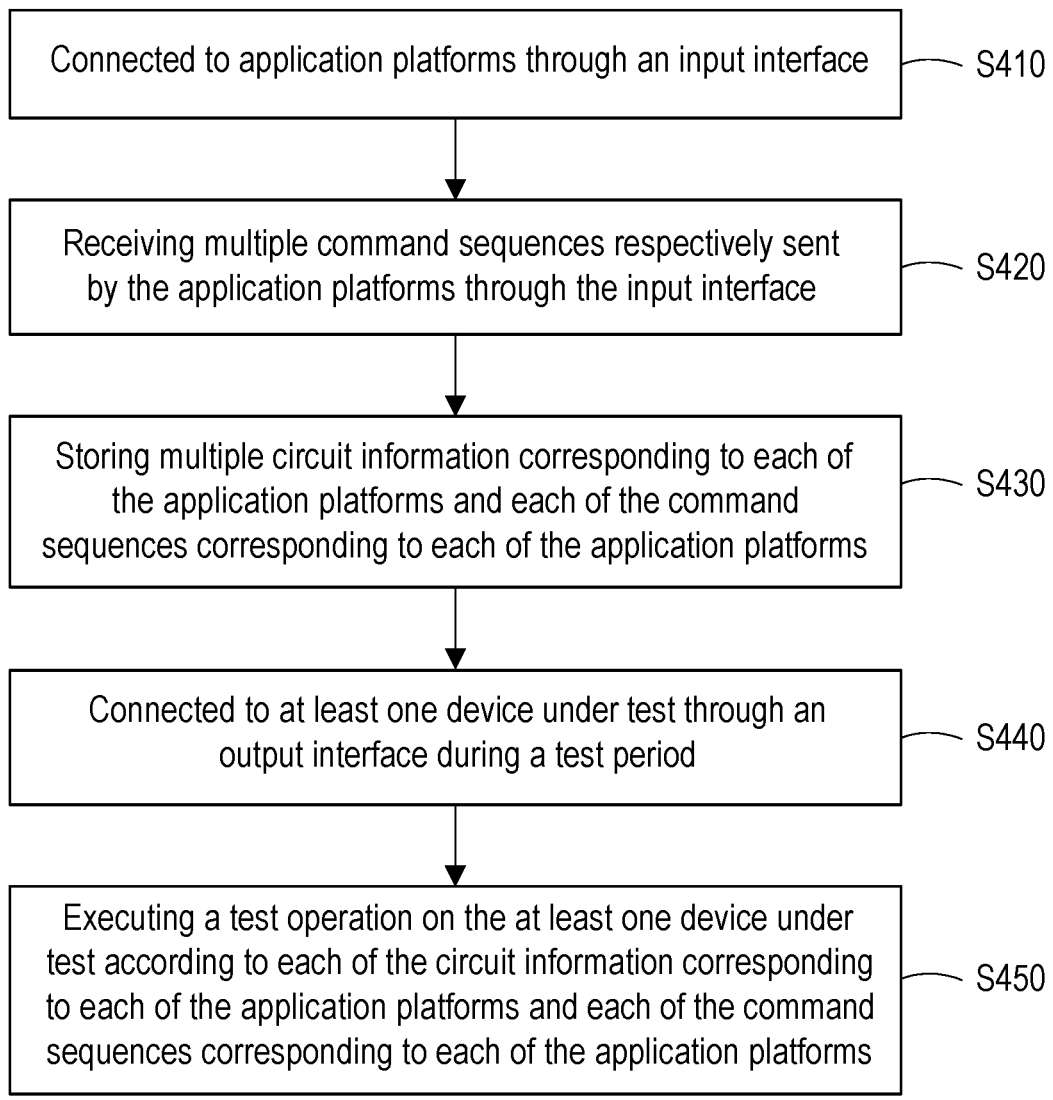
FIG. 4 is a schematic diagram of a testing method according to an embodiment of the disclosure.

Please refer to FIG. 4 for the following. FIG. 4 is a schematic diagram of a testing method according to an embodiment of the disclosure. In step S410, a testing device may be connected to multiple application platforms through an input interface. In step S420, the testing device is in the setting mode, and receives multiple command sequences respectively sent by the application platforms through the input interface. Next, in step S430, multiple circuit information corresponding to each of the application platforms and each of the command sequences corresponding to each of the application platforms are stored. After the setting is completed, in step S440, the testing device is connected to at least one device under test through an output interface during the test period. In step S450, the testing device may execute a test operation on the at least one device under test according to each of the circuit information corresponding to each of the application platforms and each of the command sequences corresponding to each of the application platforms.

The operation details of the above-mentioned steps have been described in detail in the aforementioned multiple embodiments, and are not repeated here.

To sum up, the testing device of the disclosure is electrically connected to multiple application platforms, and thereby obtaining the command sequences sent by the application platforms. The testing device of the disclosure also analyzes the circuit information of the application platform. During the test period, the testing device simulates the application platform to generate a test signal group according to the circuit information and the command sequence of the application platform, and executes test operations on one or more devices under test. The testing device may store the circuit information and the command sequences for the application platforms, and simulate the application platforms in time-sharing to execute multi-platform test operations on the devices under test, which may effectively reduce the complexity of test operations and reducing testing cost.

What is claimed is:

1. A testing device, comprising:
   a controller, connected to a plurality of application platforms through an input interface, and the controller receiving a plurality of command sequences respectively sent by each of the application platforms through the input interface; and
   a data storage device, storing a plurality of circuit information corresponding to each of the application platforms and each of the command sequences corresponding to each of the application platforms,
   wherein, the controller is connected to at least one device under test through an output interface during a test period, and the controller executes a test operation on the at least one device under test according to each of the circuit information corresponding to each of the application platforms and each of the command sequences corresponding to each of the application platforms.

2. The testing device according to claim 1, wherein the controller receives a circuit netlist of each of the application platforms, and analyzes the circuit netlist of each of the application platforms to generate each of the circuit information of each of the application platforms.

3. The testing device according to claim 2, wherein the controller analyzes the circuit netlist of each of the application platforms to obtain a parasitic effect generated by parasitic elements in circuits corresponding to each of the application platforms.

4. The testing device according to claim 2, wherein the controller receives a plurality of image of circuit boards of each of the application platforms, and generate each of the circuit information according to the image of each of the application platforms.

5. The testing device according to claim 1, wherein each of the circuit information of each of the application platforms comprises circuit routing information and element configuration position information of each of the application platforms, and a dielectric coefficient between multilayer circuit boards in each of the application platforms.

6. The testing device according to claim 1, wherein the controller generates a test signal group according to each of the circuit information corresponding to each of the application platforms and each of the command sequences corresponding to each of the application platform to perform a test operation on the at least one device under test.

7. The testing device according to claim 1, further comprising:
at least one temperature controller, coupled to the controller, the at least one temperature controller corresponding to the at least one device under test, and configured to control an ambient temperature of the at least one device under test.

8. The testing device according to claim 1, wherein the at least one device under test is a memory.

9. The testing device according to claim 1, further comprising:
a plurality of adapter boards, respectively configured to be connected to each of the application platforms,
wherein, the input interface has a transmission serial bus to be electrically connected to each of the adapter boards through pressing.

10. The testing device according to claim 1, wherein during the test period, the test device releases a connection relationship with any one of the application platforms.

11. A testing method, comprising:
connected to a plurality of application platforms through an input interface;
receiving a plurality of command sequences sent by each of the application platforms through the input interface;
storing a plurality of circuit information corresponding to each of the application platforms and each of the command sequences corresponding to each of the application platforms;
connected to at least one device under test through an output interface during a test period; and
executing a test operation on the at least one device under test according to each of the circuit information corresponding to each of the application platforms and each of the command sequences corresponding to each of the application platforms.

12. The testing method according to claim 11, further comprising:
receiving a circuit netlist of each of the application platforms, and analyzing the circuit netlist of each of the application platforms to generate each of the circuit information of each of the application platforms.

13. The testing method according to claim 12, further comprising:
analyzing the circuit netlist of each of the application platforms to obtain a parasitic effect generated by parasitic elements in circuits corresponding to each of the application platforms.

14. The testing method according to claim 12, further comprising:
receiving a plurality of image of circuit boards of each of the application platforms; and
generating each of the circuit information according to the image of each of the application platforms.

15. The testing method according to claim 11, wherein each of the circuit information of each of the application platforms comprises circuit routing information and element configuration position information of each of the application platforms, and a dielectric coefficient between multilayer circuit boards in each of the application platforms.

16. The testing method according to claim 11, wherein executing the test operation on the at least one device under test according to each of the circuit information corresponding to each of the application platforms and each of the command sequences corresponding to each of the application platforms comprises:
generating a test signal group according to each of the circuit information corresponding to each of the application platforms and each of the command sequences corresponding to each of the application platforms to perform a test operation on the at least one device under test.

17. The testing method according to claim 11, further comprising:
disposing at least one temperature controller to correspond to the at least one device under test; and
providing the at least one temperature controller to control an ambient temperature of the at least one device under test.

18. The testing method according to claim 11, further comprising:
releasing, during the test period, a connection relationship of the test device and any one of the application platforms.

* * * * *